United States Patent
Yano et al.

(10) Patent No.: US 11,430,904 B2
(45) Date of Patent: Aug. 30, 2022

(54) SOLAR CELL AND METHOD OF MANUFACTURING SOLAR CELL

(71) Applicant: Panasonic Corporation, Osaka (JP)

(72) Inventors: Ayumu Yano, Osaka (JP); Minato Seno, Osaka (JP); Shin Nanba, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 441 days.

(21) Appl. No.: 16/562,333

(22) Filed: Sep. 5, 2019

(65) Prior Publication Data
US 2020/0006590 A1 Jan. 2, 2020

Related U.S. Application Data

(63) Continuation of application No. PCT/JP2018/009892, filed on Mar. 14, 2018.

(30) Foreign Application Priority Data

Mar. 29, 2017 (JP) .............................. JP2017-065941

(51) Int. Cl.
*H01L 31/0747* (2012.01)
*H01L 31/0224* (2006.01)
(Continued)

(52) U.S. Cl.
CPC .. *H01L 31/0747* (2013.01); *H01L 31/022466* (2013.01); *H01L 31/035272* (2013.01);
(Continued)

(58) Field of Classification Search
CPC ......... H01L 31/022441; H01L 31/0682; H01L 31/0516
See application file for complete search history.

(56) References Cited

U.S. PATENT DOCUMENTS

2011/0061732 A1  3/2011 Yang et al.
2014/0224306 A1  8/2014 Chen et al.
(Continued)

FOREIGN PATENT DOCUMENTS

JP  2012-519375 A  8/2012
JP  2015-122347 A  7/2015
(Continued)

OTHER PUBLICATIONS

English machine translation of Hishida (WO 2013/038768 A1) provided by the EPO website, all pages, 2022. (Year: 2022).*
(Continued)

*Primary Examiner* — Daniel P Malley, Jr.
(74) *Attorney, Agent, or Firm* — McDermott Will & Emery LLP

(57) ABSTRACT

A solar cell includes: a crystalline semiconductor substrate of a first conductivity type; a first semiconductor layer provided on a first region on one principal surface of the substrate; a second semiconductor layer provided on a second region on the one principal surface different from the first region; a first transparent electrode layer provided on the first semiconductor layer; and a second transparent electrode layer provided on the second semiconductor layer. The first semiconductor layer includes a first amorphous semiconductor layer of the first conductivity type and a first crystalline semiconductor part extending from the one principal surface toward the first transparent electrode layer. The second semiconductor layer includes a second amorphous semiconductor layer of a second conductivity type different from the first conductivity type.

15 Claims, 5 Drawing Sheets

(51) Int. Cl.
*H01L 31/0352* (2006.01)
*H01L 31/18* (2006.01)
*H01L 31/20* (2006.01)

(52) U.S. Cl.
CPC ........ *H01L 31/1804* (2013.01); *H01L 31/202* (2013.01); *H01L 31/022458* (2013.01)

(56) References Cited

U.S. PATENT DOCUMENTS

| | | | |
|---|---|---|---|
| 2014/0224307 A1* | 8/2014 | Chen | H01L 31/022441 136/255 |
| 2015/0007881 A1* | 1/2015 | Khadilkar | C03C 8/10 136/256 |
| 2015/0059849 A1 | 3/2015 | Yang et al. | |
| 2018/0083149 A1* | 3/2018 | Kim | H01L 31/1868 |

FOREIGN PATENT DOCUMENTS

| | | | | |
|---|---|---|---|---|
| JP | 2015-185587 A | 10/2015 | | |
| WO | WO-2013038768 A1 * | 3/2013 | ......... | H01L 31/0682 |
| WO | 2013/111312 A1 | 8/2013 | | |
| WO | 2017/010029 A1 | 1/2017 | | |

OTHER PUBLICATIONS

International Search Report issued in corresponding International Patent Application No. PCT/JP2018/009892, dated May 29, 2018, with English translation.

* cited by examiner

SOLAR CELL AND METHOD OF MANUFACTURING SOLAR CELL

RELATED APPLICATIONS

This application is the U.S. Continuation of International Patent Application No. PCT/JP2018/009892, filed Mar. 14, 2018, which in turn claims the benefit of Japanese Patent Application No. 2017-065941, filed on Mar. 29, 2017, the entire disclosures of which applications are incorporated herein by reference.

BACKGROUND

1. Field of the Invention

The present disclosure relates to a solar cell and a method of manufacturing a solar cell.

2. Description of the Related Art

Solar cells having a high power generation efficiency include back surface junction type solar cells with an n-type semiconductor layer and a p-type semiconductor layer formed on a back surface, which is opposite to a light-receiving surface on which light is incident. For example, an n-type amorphous semiconductor layer and a p-type amorphous semiconductor layer are provided on one principal surface of a crystalline semiconductor substrate.

An amorphous semiconductor layer is useful for passivation of a crystalline substrate surface but may contribute to an increase in the series resistance of a solar cell. For improvement in power generation efficiency, it is preferred that the requirements for passivation and low resistance be both met.

SUMMARY

The disclosure addresses the above-described issue, and a general purpose thereof is to provide a solar cell having a higher power generation efficiency.

A solar cell according to an embodiment of the present disclosure includes: a crystalline semiconductor substrate of a first conductivity type; a first semiconductor layer provided on a first region on one principal surface of the substrate; a second semiconductor layer provided on a second region on the one principal surface different from the first region; a first transparent electrode layer provided on the first semiconductor layer; and a second transparent electrode layer provided on the second semiconductor layer. The first semiconductor layer includes a first amorphous semiconductor layer of the first conductivity type and a first crystalline semiconductor part extending from the one principal surface toward the first transparent electrode layer. The second semiconductor layer includes a second amorphous semiconductor layer of a second conductivity type different from the first conductivity type.

Another embodiment of the present disclosure relates to a method of manufacturing a solar cell. The method includes: forming a first semiconductor layer in a first region on one principal surface of a crystalline semiconductor substrate of a first conductivity type; forming a second semiconductor layer in a second region of the one principal surface different from the first region; and forming a transparent electrode layer on the first semiconductor layer and the second semiconductor layer. The first semiconductor layer includes a first amorphous semiconductor layer of the first conductivity type and a first crystalline semiconductor part extending from the one principal surface toward the transparent electrode layer. The second semiconductor layer includes a second amorphous semiconductor layer of a second conductivity type different from the first conductivity type. The first amorphous semiconductor layer and the first crystalline semiconductor part are formed at the same time.

BRIEF DESCRIPTION OF THE DRAWINGS

The figures depict one or more implementations in accordance with the present teaching, by way of example only, not by way of limitations. In the figures, like reference numerals refer to the same or similar elements.

DETAILED DESCRIPTION

Figure 1:
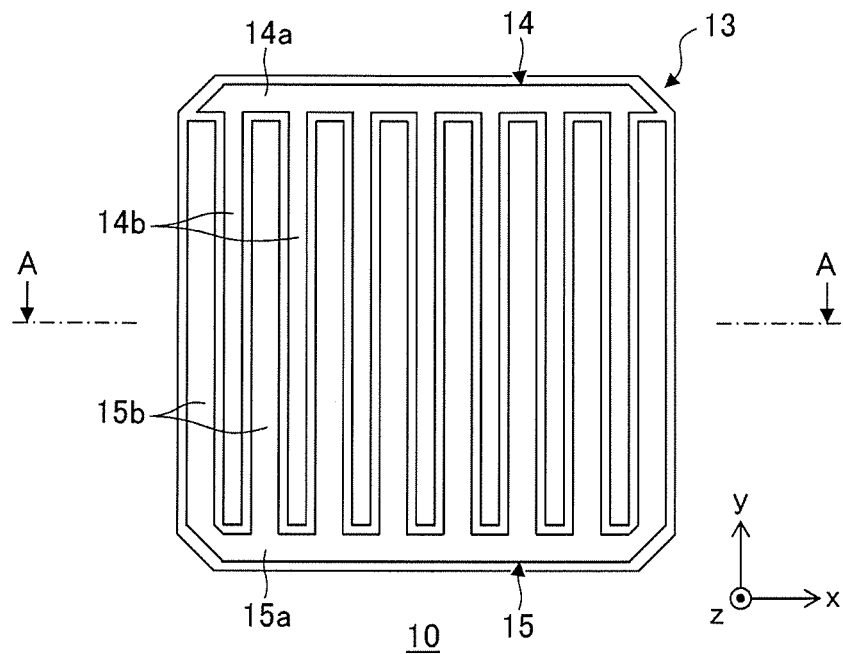
FIG. 1 is a plan view showing the structure of a solar cell according to the embodiment.

The invention will now be described by reference to the preferred embodiments. This does not intend to limit the scope of the present invention, but to exemplify the invention.

A brief summary will be given before describing the invention in specific details. An embodiment of the disclosure relates to a solar cell. The solar cell includes a crystalline semiconductor substrate of the first conductivity type, a first semiconductor layer provided on a first region on one principal surface of the substrate, a second semiconductor layer provided on a second region on the one principal surface different from the first region, a first transparent electrode layer provided on the first semiconductor layer, and a second transparent electrode layer provided on the second semiconductor layer. The first semiconductor layer includes a first amorphous semiconductor layer of the first conductivity type and a first crystalline semiconductor part extending from the one principal surface toward the first transparent electrode layer. The second semiconductor layer includes a second amorphous semiconductor layer of the second conductivity type different from the first conductivity type. According to the embodiment, the requirements for improvement in passivation by means of the amorphous semiconductor layer and for reduction of the series resistance by means of the crystalline semiconductor part can both be met and the power generation efficiency of the solar cell is increased, by providing both the amorphous semiconductor layer and the crystalline semiconductor part on the first region.

A detailed description will be given of an embodiment of the disclosure with reference to the drawings. In the explanations of the figures, the same elements shall be denoted by the same reference numerals, and duplicative explanations will be omitted appropriately.

FIG. 1 is a plan view showing a solar cell 10 according to an embodiment and shows the structure of a back surface 13 of the solar cell 10. The solar cell 10 includes a first electrode 14 and a second electrode 15 provided on the back surface 13. The solar cell 10 is a so-called back-contact solar cell. No electrodes are provided on the light-receiving surface, and both the first electrode 14 and the second electrode 15 having different polarities are provided on the back surface 13 opposite to the light-receiving surface.

The first electrode 14 includes a first bus bar electrode 14a extending in the x direction and a plurality of first finger electrodes 14b intersecting the first bus bar electrode 14a and extending in the y direction and is formed in a comb-tooth shape. The second electrode 15 includes a second bus bar electrode 15a extending in the x direction and a plurality of second finger electrodes 15b intersecting the second bus bar electrode 15a and extending in the y direction and is formed in a comb-tooth shape. The first electrode 14 and the second electrode 15 are formed such that the comb teeth of the electrodes are in mesh with each other and inserted into each other. Each of the first electrode 14 and the second electrode 15 may be a busbar-less electrode consisting only of a plurality of fingers and having no busbars.

Figure 2:
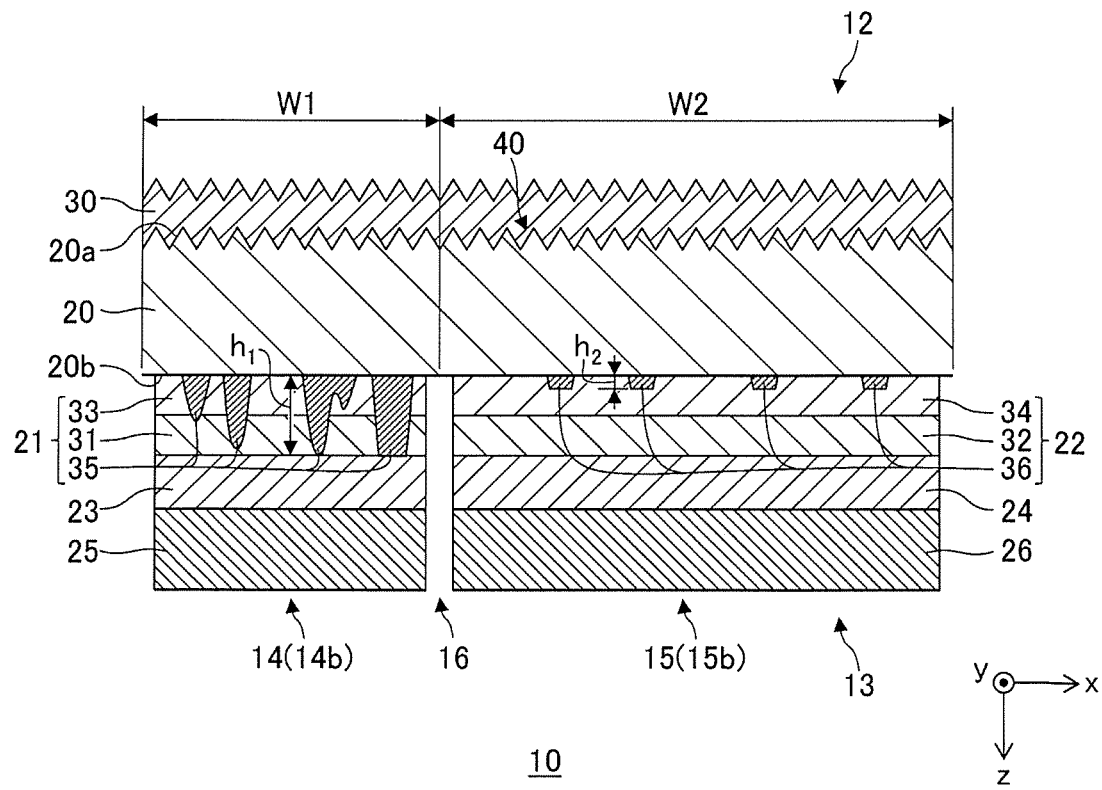
FIG. 2 is a cross-sectional view showing the structure of the solar cell of FIG. 1.

FIG. 2 is a cross-sectional view showing the structure of the solar cell 10 according to the embodiment and shows an A-A cross section of FIG. 1. The solar cell 10 includes a substrate 20, a first semiconductor layer 21, a second semiconductor layer 22, a first transparent electrode layer 23, a second transparent electrode layer 24, a first metal electrode layer 25, a second metal electrode layer 26, and a light-receiving surface protection layer 30. The solar cell 10 is a back surface junction type solar cell in which a heterojunction is formed on the back surface 13.

The solar cell 10 includes a light-receiving surface 12 and the back surface 13. The light-receiving surface 12 means a principal surface on which light (sunlight) is mainly incident in the solar cell 10 and, specifically, means a surface on which the major portion of light entering the solar cell 10 is incident. On the other hand, the back surface 13 means the other principal surface opposite to the light-receiving surface 12.

The substrate 20 is made of a crystalline semiconductor having the first conductivity. The crystalline semiconductor substrate is exemplified by a crystalline silicon (Si) wafer such as a monocrystalline silicon wafer and a polycrystalline silicon wafer. In this embodiment, it is shown that the substrate 20 is an n-type monocrystalline silicon wafer, the first conductivity type is the n-type, and the second conductivity type is the p-type. The substrate 20 contains an impurity of the first conductivity type. For example, the substrate 20 contains phosphorus (P) as an n-type impurity for doping silicon. The density of the n-type impurity of the substrate 20 is not limited to any level. For example, the density is about $1\times10^{15}/cm^3$-$1\times10^{16}/cm^3$.

The solar cell can be comprised of a semiconductor substrate other than a crystalline semiconductor substrate. For example, a compound semiconductor wafer comprised of gallium arsenide (GaAs) or indium phosphorus (InP) may be used. Further, the first conductivity type may be the p-type, and the second conductivity type may be the n-type.

The substrate 20 has a first principal surface 20a on the side of the light-receiving surface 12 and a second principal surface 20b on the side of the back surface 13. The substrate 20 absorbs light incident on the first principal surface 20a and generates electrons and holes as carriers. The first principal surface 20a is provided with a texture structure 40 for increasing the efficiency of absorbing incident light. Meanwhile, the second principal surface 20b is not provided with a texture structure like that of the first principal surface 20a. The flatness of the second principal surface 20b is higher than that of the first principal surface 20a. The second principal surface 20b may be provided with a texture structure at least in part. For example, the texture structure on the second principal surface 20b may differ between a first region W1 and a second region W2 described later.

The first semiconductor layer 21 and the second semiconductor layer 22 are provided on the second principal surface 20b of the substrate 20. The first semiconductor layer 21 is provided on the first region W1 on the second principal surface 20b, and the second semiconductor layer 22 is provided on the second region W2 on the second principal surface 20b different from the first region W1. The first semiconductor layer 21 and the second semiconductor layer 22 are formed in a comb-tooth shape corresponding to the first electrode 14 and the second electrode 15, respectively. The first semiconductor layer 21 and the second semiconductor layer 22 are formed so as to be inserted into each other. Therefore, the first region W1 and the second region W2 are arranged on the second principal surface 20b so as to alternate in the x direction.

The first region W1 is a first conductivity type region and collects those of carriers generated in the substrate 20 that are of the first conductivity. Since the substrate 20 has the first conductivity type, it can be said that the first region W1 is a region that collects majority carriers. Meanwhile, the second region W2 is a second conductivity type region and collects carries of the second conductivity type, i.e., minority carriers. Given that the first conductivity type is the n-type and the second conductivity type is the p-type, the first region W1 collects electrons, and the second region W2 collects holes.

The efficiency of collecting minority carriers is lower than that of majority carriers. Accordingly, a second area S2 of the second region W2 on the side of minority carriers is configured to be larger than a first area S1 of the first region W1 on the side of majority carriers in order to increase the power generation efficiency of the cell as a whole. The ratio between the first area S1 and the second area S2, i.e., S2/S1, is configured to be not less than 1.5 and not more than 5. For example, the ratio is configured to be not less than 2 and not more than 4.

The first semiconductor layer 21 includes a first amorphous semiconductor layer 31, a third amorphous semiconductor layer 33, and a first crystalline semiconductor part 35. The third amorphous semiconductor layer 33 is provided on the second principal surface 20b, and the first amorphous semiconductor layer 31 is provided on the third amorphous semiconductor layer 33. The first crystalline semiconductor part 35 is provided within the first amorphous semiconductor layer 31 and the third amorphous semiconductor layer 33 and is provided to extend in a columnar shape from the second principal surface 20b toward the first transparent electrode layer 23.

The first amorphous semiconductor layer 31 is an amorphous semiconductor layer of the first conductivity type and is made of, for example, an n-type amorphous silicon containing hydrogen (H). The first amorphous semiconductor layer 31 has a thickness of, for example, about 2 nm-50 nm. It is preferred that the first amorphous semiconductor layer 31 contain, for example, phosphorous (P) as the impurity of the first conductivity type, which is also the type of the substrate 20, and that the impurity density be higher than that of the substrate 20. The impurity density in the first amorphous semiconductor layer 31 is about $1 \times 10^{20}/cm^3$-$1 \times 10^{21}/cm^3$.

The third amorphous semiconductor layer 33 is made of a substantially intrinsic amorphous semiconductor. For example, the third amorphous semiconductor layer 33 is made of an i-type amorphous silicon containing hydrogen. In this specification, a substantially intrinsic semiconductor will be referred to as "i-type semiconductor". A substantially intrinsic semiconductor includes a semiconductor layer formed without intentionally using an n-type or p-type impurity element and includes a semiconductor layer formed without supplying a dopant gas during chemical vapor deposition (CVD) etc. Specifically, it includes silicon obtained by supplying silane ($SiH_4$) diluted with hydrogen ($H_2$) without supplying a dopant gas such as diborane ($B_2H_6$) and phosphine ($PH_3$).

The third amorphous semiconductor layer 33 is provided between the second principal surface 20b and the first amorphous semiconductor layer 31 and has a thickness of, about 2 nm-25 nm. The third amorphous semiconductor layer 33 may not be provided, and the first amorphous semiconductor layer 31 may be provided immediately above the second principal surface 20b in the first region W1.

The first crystalline semiconductor part 35 is made of a crystalline semiconductor and includes, for example, at least one of monocrystalline silicon, polycrystalline silicon, and microcrystalline silicon. The first crystalline semiconductor part 35 is a portion having a crystallinity different from that of the first amorphous semiconductor layer 31 and the third amorphous semiconductor layer 33 and can be said to be a portion made of a semiconductor that is not amorphous. The first crystalline semiconductor part 35 includes at least one of crystalline silicon of the first conductivity type and i-type crystalline silicon. For example, the first crystalline semiconductor part 35 may include an i-type portion provided on the second principal surface 20b and a portion of the first conductivity type provided on the i-type portion.

The first crystalline semiconductor part 35 is provided to extend through the first amorphous semiconductor layer 31 and the third amorphous semiconductor layer 33 and reach the first transparent electrode layer 23. In other words, the height $h_1$ of the first crystalline semiconductor part 35 from the second principal surface 20b is comparable to the thickness of the stack of the first amorphous semiconductor layer 31 and the third amorphous semiconductor layer 33.

The first crystalline semiconductor part 35 may be provided to extend through only the third amorphous semiconductor layer 33 and reach halfway through the first amorphous semiconductor layer 31. In this case, the height of the first crystalline semiconductor part 35 is smaller than the thickness of the stack of the first amorphous semiconductor layer 31 and the third amorphous semiconductor layer 33. Further, the first crystalline semiconductor part 35 may be provided so as not to extend through the third amorphous semiconductor layer 33 and to reach halfway through the third amorphous semiconductor layer 33. In this case, the height of the first crystalline semiconductor part 35 is smaller than the thickness of the third amorphous semiconductor layer 33. Further, the first crystalline semiconductor part 35 may be provided at different heights.

The first crystalline semiconductor part 35 is provided in part on the first region W1 on the second principal surface 20b. For example, the first crystalline semiconductor part 35 is provided discretely on the second principal surface 20b. For example, the first crystalline semiconductor part 35 is provided as islands in a planar view of the second principal surface 20b such that a plurality of columnar parts are formed. The proportion of the area in the first region W1 occupied by the first crystalline semiconductor part 35 is preferably not less than 0.05% and not more than 20%, and, more preferably, not less than 0.1% and not more than 10%. In a view as shown in FIG. 2 of the cross section intersecting the second principal surface 20b, the proportion of the area occupied by the first crystalline semiconductor part 35 within the first amorphous semiconductor layer 31 and the third amorphous semiconductor layer 33 is preferably not less than 0.02% and not more than 10%, and, more preferably, not less than 0.05% and not more than 5%. By defining such numerical ranges, the requirements for improvement in passivation by means of the first amorphous semiconductor layer 31 and the third amorphous semiconductor layer 33 and reduction of the series resistance by means of the first crystalline semiconductor part 35 can both be met suitably.

The second semiconductor layer 22 includes a second amorphous semiconductor layer 32, a fourth amorphous semiconductor layer 34, and a second crystalline semiconductor part 36. The fourth amorphous semiconductor layer 34 is provided on the second principal surface 20b, and the second amorphous semiconductor layer 32 is provided on the fourth amorphous semiconductor layer 34. The second crystalline semiconductor part 36 is provided within the fourth amorphous semiconductor layer 34 on the second principal surface 20b.

The second amorphous semiconductor layer 32 is an amorphous semiconductor layer of the second conductivity type different from the first conductivity type and is made of, for example, an p-type amorphous silicon containing hydrogen. The second amorphous semiconductor layer 32 has a thickness of, for example, about 2 nm-50 nm. The second amorphous semiconductor layer 32 contains, for example, boron (B) as the impurity of the second conductivity type.

The fourth amorphous semiconductor layer 34 is made of a substantially intrinsic amorphous semiconductor. For example, the fourth amorphous semiconductor layer 34 is made of an i-type amorphous silicon containing hydrogen. The fourth amorphous semiconductor layer 34 is provided between the second principal surface 20b and the second amorphous semiconductor layer 32 and has a thickness of, about 2 nm-25 nm.

It is preferred that the fourth amorphous semiconductor layer 34 have a lower film density than the first amorphous semiconductor layer 31 or the third amorphous semiconductor layer 33. For example, it is preferred that the film density of the fourth amorphous semiconductor layer 34 be not less than 2.0 $g/cm^3$ and not more than 2.2 $g/cm^3$, given that the film density of the first amorphous semiconductor layer 31 or the third amorphous semiconductor layer 33 is not less than 2.2 $g/cm^3$ and not more than 2.4 $g/cm^3$. The fourth amorphous semiconductor layer 34 is configured such that the film density thereof is lower at least in a portion in contact with the second principal surface 20b. Therefore, the film density of the portion of the fourth amorphous semiconductor layer 34 in contact with the second amorphous semiconductor layer 32 may be higher than the film density of the portion in contact with the second principal surface 20b and may be comparable to the film density of the first amorphous semiconductor layer 31 or the third amorphous semiconductor layer 33.

The fourth amorphous semiconductor layer 34 may not be provided, and the second amorphous semiconductor layer 32 may be provided immediately above the second principal surface 20b in the second region W2. In this case, the film density of at least the portion of the second amorphous semiconductor layer 32 in contact with the second principal surface 20b may be lower than that of the first amorphous semiconductor layer 31 or the third amorphous semiconductor layer 33 and may be, for example, not less than 2.0 g/cm$^3$ and not more than 2.2 g/cm$^3$.

Like the first crystalline semiconductor part 35, the second crystalline semiconductor part 36 is made of a crystalline semiconductor and includes, for example, at least one of monocrystalline silicon, polycrystalline silicon, and microcrystalline silicon. The second crystalline semiconductor part 36 is a portion having a crystalline nature different from that of the second amorphous semiconductor layer 32 and the fourth amorphous semiconductor layer 34 and is a portion made of a semiconductor that is not amorphous. The second crystalline semiconductor part 36 includes at least one of crystalline silicon of the second conductivity type and i-type crystalline silicon.

Like the first crystalline semiconductor part 35, the second crystalline semiconductor part 36 is provided in part on the second region W2 on the second principal surface 20b. Meanwhile, the second crystalline semiconductor part 36 is provided such that the amount thereof per a unit area is smaller than that of the first crystalline semiconductor part 35. For example, the area occupied by the second crystalline semiconductor part 36 per a unit area on the second region W2 on the second principal surface 20b is smaller than the area occupied by the first crystalline semiconductor part 35 per a unit area on the first region W1 on the second principal surface 20b. The second crystalline semiconductor part 36 may not be provided.

The height $h_2$ of the second crystalline semiconductor part 36 from the second principal surface 20b is smaller than the height $h_1$ of the first crystalline semiconductor part 35 from the second principal surface 20b. For example, the second crystalline semiconductor part 36 is provided so as not to reach the second transparent electrode layer 24 and not to extend through the fourth amorphous semiconductor layer 34. Therefore, the height $h_2$ of the second crystalline semiconductor part 36 may be smaller than the thickness of the fourth amorphous semiconductor layer 34.

The first transparent electrode layer 23 is provided on the first semiconductor layer 21, and the second transparent electrode layer 24 is provided on the second semiconductor layer 22. The first transparent electrode layer 23 and the second transparent electrode layer 24 are formed by, for example, a transparent conductive oxide (TCO) such as tin oxide (SnO$_2$), zinc oxide (ZnO), and indium tin oxide (ITO) that is doped with tin (Sn), antimony (Sb), fluorine (F), aluminum, etc. In this embodiment, the first transparent electrode layer 23 and the second transparent electrode layer 24 are formed by an indium tin oxide. The thickness of the first transparent electrode layer 23 and the second transparent electrode layer 24 may be, for example, about 50 nm-100 nm.

The first metal electrode layer 25 is provided on the first transparent electrode layer 23, and the second metal electrode layer 26 is provided on the second transparent electrode layer 24. The first metal electrode layer 25 and the second metal electrode layer 26 are a conductive material layer that contains a metal such as copper (Cu), tin (Sn), gold (Au), silver (Ag), nickel (Ni), and titanium (Ti). The first metal electrode layer 25 and the second metal electrode layer 26 may be comprised of a single layer or a plurality of layers. For example, the first metal electrode layer 25 and the second metal electrode layer 26 may include a seed layer of about 50 nm-1100 nm, a first plating layer of about 11 µm-50 µm, and a second plating layer of about 1 µm-5 µm. For example, the seed layer and the first plating layer are made of copper (Cu), and the second plating layer is made tin (Sn).

In this embodiment, the first electrode 14 is formed by the first transparent electrode layer 23 and the first metal electrode layer 25, and the second electrode 15 is formed by the second transparent electrode layer 24 and the second metal electrode layer 26. The first electrode 14 collects carries of the first conductivity type, and the second electrode 15 collects carriers of the second conductivity type. An isolation groove 16 is provided between the first electrode 14 and the second electrode 15 to insulate the first electrode 14 and the second electrode 15 electrically. An insulating material may be provided inside the isolation groove 16. For example, an insulating material such as silicon oxide (SiO$_2$), silicon nitride (SiN), and silicon oxynitride (SiON) may be provided.

The light-receiving surface protection layer 30 is provided on the first principal surface 20a. The light-receiving surface protection layer 30 functions as a passivation layer of the first principal surface 20a. The passivation layer may include at least one of a substantially intrinsic amorphous semiconductor layer, an amorphous semiconductor layer of the first conductivity type, and an amorphous semiconductor layer of the second conductivity type. The passivation layer can be made of amorphous silicon containing hydrogen, silicon oxide, silicon nitride, silicon oxynitride, or the like. The passivation layer has a thickness of, for example, about 2 nm to 50 nm.

The light-receiving surface protection layer 30 may also have a function of an antireflection film or a protection film. The antireflection film or the protection film insulating layer can be made of silicon oxide, silicon nitride, silicon oxynitride. The thickness of the antireflection film or the protection film insulating layer is configured as appropriate in accordance with, for example, the antireflection property. For example, the thickness is about 80 nm-1100 nm.

Figure 3:
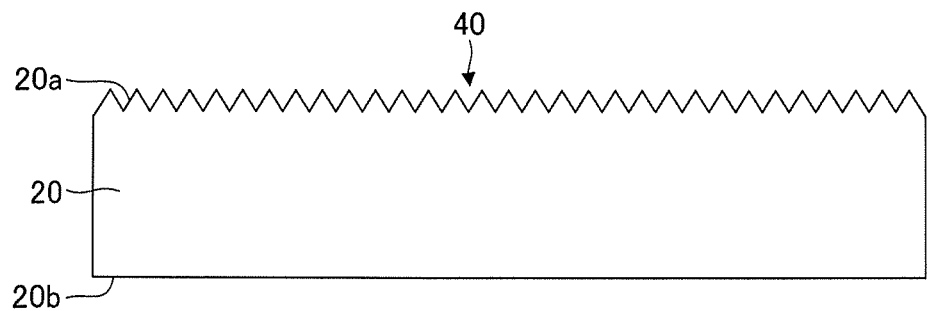
FIG. 3 schematically shows a step of manufacturing the solar cell.

A description will now be given of a method of manufacturing the solar cell 10. First, as shown in FIG. 3, the texture structure 40 is formed on the first principal surface 20a of the substrate 20. The method of forming the texture structure 40 is not particularly limited. For example, the structure can be formed by anisotropic etching using an alkaline solution. Meanwhile, the texture structure is not formed on the second principal surface 20b of the substrate 20. The substrate 20 as shown may be formed by forming a texture structure on both surfaces 20a, 20b of the substrate and then removing the texture structure on the second principal surface 20b by wet etching or dry etching.

Figure 4:
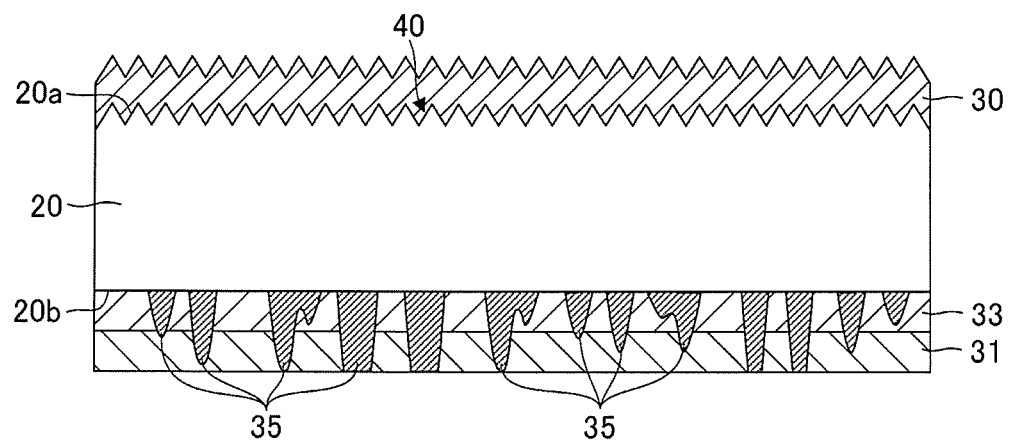
FIG. 4 schematically shows a step of manufacturing the solar cell.

Then, as shown in FIG. 4, the light-receiving surface protection layer 30 is formed on the first principal surface 20a, and the third amorphous semiconductor layer 33, the first amorphous semiconductor layer 31, and the first crystalline semiconductor part 35 are formed on the second principal surface 20b. The light-receiving surface protection layer 30, the first amorphous semiconductor layer 31, the third amorphous semiconductor layer 33, and the first crystalline semiconductor part 35 can be formed by a chemical vapor deposition (CVD) method such as a plasma CVD method.

In regard to the second principal surface 20b, the third amorphous semiconductor layer 33 is formed on the second principal surface 20b, and then the first amorphous semiconductor layer 31 of the first conductivity type is formed on the third amorphous semiconductor layer 33. When the first amorphous semiconductor layer 31 and the third amorphous semiconductor layer 33 are formed, the first crystalline semiconductor part 35 is formed at the same time. The second principal surface 20b is comprised of the (100) face of crystal silicon at least in part. Therefore, crystalline silicon can be formed in part even under the condition of forming amorphous silicon. When crystalline silicon is formed in part on the second principal surface 20b, the first crystalline semiconductor part 35 will grow from the location of formation. As a result, the layer in which amorphous silicon and columnar crystalline silicon are mixed can be formed in one sitting.

The proportion of the amorphous semiconductor layers 31, 33 and the crystalline semiconductor part 35 formed on the second principal surface 20b can be adjusted by controlling the condition of the second principal surface 20b and the condition of forming the semiconductor layers. Crystalline silicon grows easily on the (100) face of the crystalline silicon surface, and crystalline silicon does not grow easily on the (111) face. Therefore, the proportion of the portion in which the first crystalline semiconductor part 35 is formed can be controlled by adjusting the proportion occupied by the (100) face and the (111) face on the second principal surface 20b. For example, the proportion occupied by the first crystalline semiconductor part 35 can be reduced by forming a texture structure in part on the second principal surface 20b to increase the proportion of the (111) face. When the formation speed is increased, crystalline silicon is not easily formed. Therefore, the proportion of the first crystalline semiconductor part 35 formed can also be controlled by adjusting the formation speed of the first amorphous semiconductor layer 31 and the third amorphous semiconductor layer 33.

Meanwhile, the light-receiving surface protection layer 30 is formed on the first principal surface 20a. When the light-receiving surface protection layer 30 is an amorphous silicon layer, the light-receiving surface protection layer 30 can be formed concurrently with forming the first amorphous semiconductor layer 31, the third amorphous semiconductor layer 33, and the first crystalline semiconductor part 35. The light-receiving surface protection layer 30 may substantially include amorphous silicon only or may include crystalline silicon. The light-receiving surface protection layer 30 may include more crystalline silicon or less crystalline silicon than the second principal surface 20b. The light-receiving surface protection layer 30 may not be formed concurrently with forming the first amorphous semiconductor layer 31, the third amorphous semiconductor layer 33, and the first crystalline semiconductor part 35 and may be formed prior to the formation of these layers or subsequent to the formation of these layers.

Figure 5:
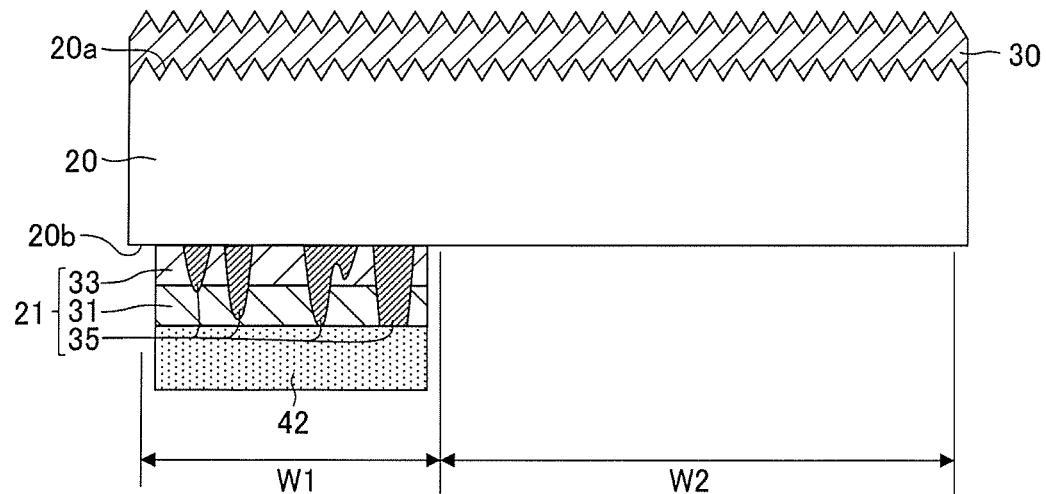
FIG. 5 schematically shows a step of manufacturing the solar cell.

Subsequently, as shown in FIG. 5, a mask 42 is formed in part on the first amorphous semiconductor layer 31 and the first crystalline semiconductor part 35. The first amorphous semiconductor layer 31, the third amorphous semiconductor layer 33, and the first crystalline semiconductor part 35 in a region in which the mask 42 is not formed are removed. The mask 42 is provided at a position corresponding to the first region W1. This causes the first amorphous semiconductor layer 31, the third amorphous semiconductor layer 33, and the first crystalline semiconductor part 35 to remain only in the first region W1, thereby completing the first semiconductor layer 21. In the second region W2 different from the first region W1, the second principal surface 20b is exposed.

Figure 6:
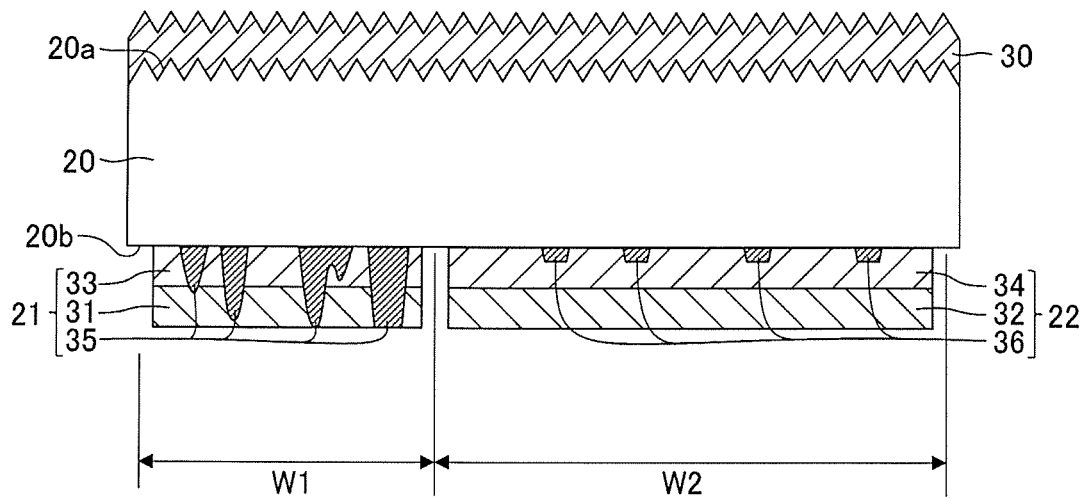
FIG. 6 schematically shows a step of manufacturing the solar cell.

Subsequently, as shown in FIG. 6, the fourth amorphous semiconductor layer 34, the second amorphous semiconductor layer 32, and the second crystalline semiconductor part 36 are formed on the second principal surface 20b exposed in the second region W2. First, the i-type fourth amorphous semiconductor layer 34 is formed on the second principal surface 20b, and then the second amorphous semiconductor layer 32 of the second conductivity type is formed on the fourth amorphous semiconductor layer 34. When the second amorphous semiconductor layer 32 and the fourth amorphous semiconductor layer 34 are formed, the second crystalline semiconductor part 36 can be formed at the same time. This completes the second semiconductor layer 22.

In the second region W2, the second amorphous semiconductor layer 32 and the fourth amorphous semiconductor layer 34 are formed under the condition in which growth of crystalline silicon is more easily inhibited than in the first region W1. For example, one of the second amorphous semiconductor layer 32 and the fourth amorphous semiconductor layer 34 is formed at a deposition rate higher than that of the first amorphous semiconductor layer 31 and the third amorphous semiconductor layer 33. As a result, at least one of the second amorphous semiconductor layer 32 and the fourth amorphous semiconductor layer 34 will have a smaller film density than the first amorphous semiconductor layer 31 and the third amorphous semiconductor layer 33.

The texture structure (not shown) may be formed in the second region W2 on the second principal surface 20b by anisotropic etching of the second principal surface 20b exposed in the second region W2. Formation of the second crystalline semiconductor part 36 may be inhibited by selectively forming a texture in the second region W2 on the second principal surface 20b to increase the proportion occupied by the (111) plane. This can reduce the proportion of the second crystalline semiconductor part 36 included in the second semiconductor layer 22. For example, the proportion of the area on the second region W2 occupied by the second crystalline semiconductor part 36 can be made smaller than the proportion of the area on the first region W1 occupied by the first crystalline semiconductor part 35. For example, when the proportion of the first crystalline semiconductor part 35 and the second crystalline semiconductor part 36 is identified by the cross section intersecting the second principal surface 20b, the proportion of the area within the second amorphous semiconductor layer 32 and the fourth amorphous semiconductor layer 34 occupied by the second crystalline semiconductor part 36 can be made smaller than the proportion of the area within the first amorphous semiconductor layer 31 and the third amorphous semiconductor layer 33 occupied by the first crystalline semiconductor part 35.

Subsequently, the first transparent electrode layer 23 and the first metal electrode layer 25 are formed on the first semiconductor layer 21, and the second transparent electrode layer 24 and the second metal electrode layer 26 are formed on the second semiconductor layer 22. The first transparent electrode layer 23 and the second transparent electrode layer 24 are formed by a film forming method such as a CVD method like a plasma CVD method, sputtering, etc. The first metal electrode layer 25 and the second metal electrode layer 26 are formed by sputtering, plating, etc.

This completes the solar cell 10 shown in FIG. 2. In the manufacturing method described above, the second semiconductor layer 22 is formed after forming the first semiconductor layer 21 and removing a part of the first semiconductor layer 21. Alternatively, the sequence of forming the first semiconductor layer 21 and the second semiconductor layer 22 may be reversed. In other words, the first semiconductor layer 21 may be formed after forming the second semiconductor layer 22 on the entirety of the second principal surface 20b and removing a part of the second semiconductor layer 22. Optionally, the first semiconductor layer 21 and the second semiconductor layer 22 may be formed only in the associated regions by providing a mask on the second principal surface 20b.

According to this embodiment, passivation in the first region W1 is prevented from being reduced significantly and the series resistance in the first region W1 is reduced by mixing the amorphous semiconductor layers 31, 33 and the crystalline semiconductor part 35 in the first region W1. In order to enhance passivation of the first region W1, it is preferred to terminate the dangling-bond of the second principal surface 20b of the substrate 20 with hydrogen (H), and it is preferred to coat the entirety of the second principal surface 20b with an amorphous semiconductor containing hydrogen. This is because lattice defects are included in a microcrystalline or polycrystalline semiconductor, and the above approach leads to reduction of passivation caused by lattice defects. Meanwhile, an amorphous semiconductor has a lower conductivity than a crystalline semiconductor, which contributes to an increase in the series resistance of the solar cell 10.

We have found that the power generation efficiency of the solar cell 10 can be further improved by forming both the amorphous semiconductor layers 31, 33 and the crystalline semiconductor part 35 in the first region W1 and mixing them in an appropriate proportion. According to one embodiment, the power generation efficiency can be increased as compared with the case of not providing the first crystalline semiconductor part 35 by configuring the proportion of the area on the first region W1 occupied by the first crystalline semiconductor part 35 to be not less than 0.05% and not more than 20%, and, preferably, not less than 0.1% and not more than 10%. Further, the power generation efficiency can be increased by configuring the proportion of the area within the first amorphous semiconductor layer 31 and the third amorphous semiconductor layer 33 occupied by the first crystalline semiconductor part 35 to be not less than 0.02% and not more than 10%, and, preferably, not less than 0.05% and not more than 5% in a view of the cross section intersecting the second principal surface 20b. One reason for this is that the neighborhood of the first region W1 is a region characterized by a low minority carrier density and that reduction of passivation resulting from providing the first crystalline semiconductor part 35 does not lead to a significant increase in the carrier recombination speed.

Meanwhile, it is preferred that the second crystalline semiconductor part 36 be not substantially provided in the second region W2. If the second crystalline semiconductor part 36 is provided, the proportion thereof is preferably smaller than that of the first region W1. This is because the area of the second region W2 is larger than the area of the first region W1, the current density in the second region W2 is low as compared with the first region W1 accordingly, and so reduction in the series resistance in the second region W2 does not contribute much to improvement in the power generation efficiency.

Based on the foregoing consideration, passivation of a certain level or higher is provided in both the first region W1 and the second region W2, and, at the same time, the series resistance of the first region W1 can be lowered according to this embodiment. This allows collecting carriers efficiently both from the first region W1 and the second region W2 and, at the same time, reducing the series resistance between the first electrode 14 and the second electrode 15 of the solar cell 10. As a result, the power generation efficiency of the solar cell 10 is improved.

According to this embodiment, the advantage of reducing the resistance by means of the first crystalline semiconductor part 35 is enhanced by causing the first crystalline semiconductor part 35 to extend from the second principal surface 20b toward the first transparent electrode layer 23 in a columnar shape. In the case the first crystalline semiconductor part 35 is provided to reach the first transparent electrode layer 23, the substrate 20 and the second transparent electrode layer 24 is directly connected by the low-resistance first crystalline semiconductor part 35 so that the series resistance of the first region W1 is further reduced. In particular, the advantage of reducing the series resistance is enhanced by providing the first crystalline semiconductor part 35 to extend through at least the i-type third amorphous semiconductor layer 33 having a low conductivity.

An embodiment of the disclosure is defined as follows. A solar cell (10) according to one embodiment includes:

a crystalline semiconductor substrate (20) of a first conductivity type;

a first semiconductor layer (21) provided on a first region (W1) on one principal surface (the second principal surface 20b) of the substrate (20);

a second semiconductor layer (22) provided on a second region (W2) on the one principal surface (the second principal surface 20b) different from the first region (W1);

a first transparent electrode layer (23) provided on the first semiconductor layer (21); and a second transparent electrode layer (24) provided on the second semiconductor layer (22).

The first semiconductor layer (21) includes a first amorphous semiconductor layer (31) of the first conductivity type and a first crystalline semiconductor part (35) extending from the one principal surface (the second principal surface 20b) toward the first transparent electrode layer (23) in a columnar shape, and the second semiconductor layer (22) includes a second amorphous semiconductor layer (32) of a second conductivity type different from the first conductivity type.

The first semiconductor layer may further include a third amorphous semiconductor layer (33) that is provided between the one principal surface (the second principal surface 20b) and the first amorphous semiconductor layer (31) and that is substantially intrinsic.

The first crystalline semiconductor part (35) may be provided to extend through at least the third amorphous semiconductor layer (33) and reach the first amorphous semiconductor layer (31).

A film density of at least a portion of the second amorphous semiconductor layer (32) in contact with the one principal surface (the second principal surface 20b) is lower than a portion of the first semiconductor layer (21) in contact with the one principal surface (the second principal surface 20b).

The second semiconductor layer (22) may further include a fourth amorphous semiconductor layer (34) that is provided between the one principal surface (the second principal surface 20b) and the second amorphous semiconductor layer (32) and that is substantially intrinsic.

A film density of at least a portion of the fourth amorphous semiconductor layer (34) in contact with the one principal surface (the second principal surface 20b) is lower than a portion of the first semiconductor layer (21) in contact with the one principal surface (the second principal surface 20b).

The portion of the first semiconductor layer (21) in contact with the one principal surface (the second principal surface 20b) may be one of the first amorphous semiconductor layer (31) and the third amorphous semiconductor layer (33).

The first crystalline semiconductor part (35) may reach the first transparent electrode layer (23).

The first crystalline semiconductor part (35) may be provided in part on the first region (W1).

The first amorphous semiconductor layer (31) may have a higher density of impurity of the first conductivity type than the substrate (20).

The second semiconductor layer (22) may further include a second crystalline semiconductor part (36) provided on the one principal surface (the second principal surface 20b).

An amount of the first crystalline semiconductor part provided per a unit area on the first region (W1) may be higher than an amount of the second crystalline semiconductor part (36) provided per a unit area on the second region (W2).

A height ($h_1$) of the first crystalline semiconductor part (35) from the one principal surface (the second principal surface 20b) is larger than a height ($h_2$) of the second crystalline semiconductor part (36) from the one principal surface (the second principal surface 20b).

The first region (W1) may be narrower than the second region (W2).

Another embodiment relates to a method of manufacturing a solar cell (10). The method includes:

forming a first semiconductor layer (21) in a first region W1 on one principal surface (the second principal surface 20b) of a crystalline semiconductor substrate (20) of a first conductivity type;

forming a second semiconductor layer (22) in a second region (W2) of the one principal surface (the second principal surface 20b) different from the first region (W1); and forming a transparent electrode layer (the first transparent electrode layer 23, the second transparent electrode layer 24) on the first semiconductor layer (21) and the second semiconductor layer (22).

The first semiconductor layer (21) includes a first amorphous semiconductor layer (31) of the first conductivity type and a first crystalline semiconductor part (35) extending from the one principal surface (the second principal surface 20b) toward the transparent electrode layer (the first transparent electrode layer 23) in a columnar shape, and the second semiconductor layer (22) includes a second amorphous semiconductor layer (32) of a second conductivity type different from the first conductivity type, and the first amorphous semiconductor layer (31) and the first crystalline semiconductor part (35) are formed at the same time.

The first amorphous semiconductor layer (31) and the first crystalline semiconductor part (35) may be formed on a foundation of a texture structure formed at least in part on the one principal surface (the second principal surface 20b).

(Variation 1)

Figure 7:
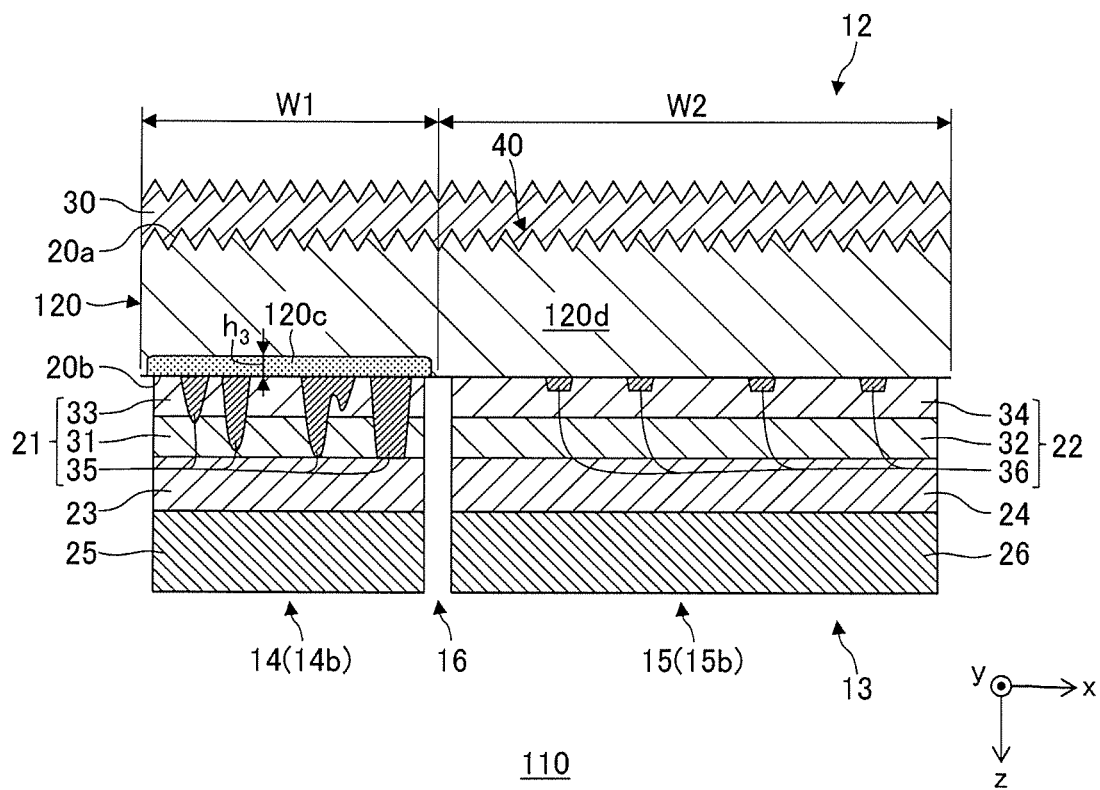
FIG. 7 is a cross-sectional view showing the structure of a solar cell according to a variation.

FIG. 7 is a cross-sectional view showing the structure of a solar cell 110 according to a variation. The variation differs from the embodiment described above in that a high impurity density region 120c having a high density of an impurity of the first conductivity type is provided in the neighborhood of the second principal surface 20b in the first region W1. A substrate 120 includes a bulk region 120d having a low density of the impurity of the first conductivity type and a high impurity density region 120c having a high density of the impurity of the first conductivity type. As shown in FIG. 7, the high impurity density region 120c is located immediately above the second principal surface 20b in the first region W1 when the second principal surface 20b is viewed from below. When FIG. 7 is turned upside down and the second principal surface 20b is viewed from above, the high impurity density region 120c can be said to be located immediately below the second principal surface 20b in the first region W1.

The high impurity density region 120c is provided in the first region W1 and is provided to avoid the second region W2. The impurity density of the high impurity density region 120c is about $1\times10^{17}/cm^3$-$1\times10^{20}/cm^3$, and, for example, about $1\times10^{18}/cm^3$-$2\times10^{19}/cm^3$. For example, the high impurity density region 120c includes phosphorous (P) as the impurity of the first conductivity type. The impurity density in the high impurity density region 120c may be higher than the impurity density in the first amorphous semiconductor layer 31.

The high impurity density region 120c is formed to have a depth $h_3$ from the second principal surface 20b of 5 μm or less. For example, the high impurity density region 120c is formed to have a depth of 200 nm or less, and, preferably, about 5 nm-100 nm. The high impurity density region 120c can be formed by, for example, diffusing the impurity of the first conductivity in the first region W1 from the second principal surface 20b. The high impurity density region 120c may be formed by ion implantation.

According to this variation, the amount of minority carriers in the neighborhood of the first region W1 is further reduced and passivation is further improved by providing the high impurity density region 120c. This compensates for the reduction of passivation resulting from providing the first crystalline semiconductor part 35, and the requirements for passivation and low resistance are both met more suitably.

In the solar cell (110) according to one embodiment, the substrate (120) may include a high impurity density region (120c) provided immediately below the one principal surface (the second principal surface 20b) in the first region (W1) and having a higher density of an impurity of the first conductivity type than the other portion (the bulk region 120b) of the substrate (120).

(Variation 2)

Figure 8:
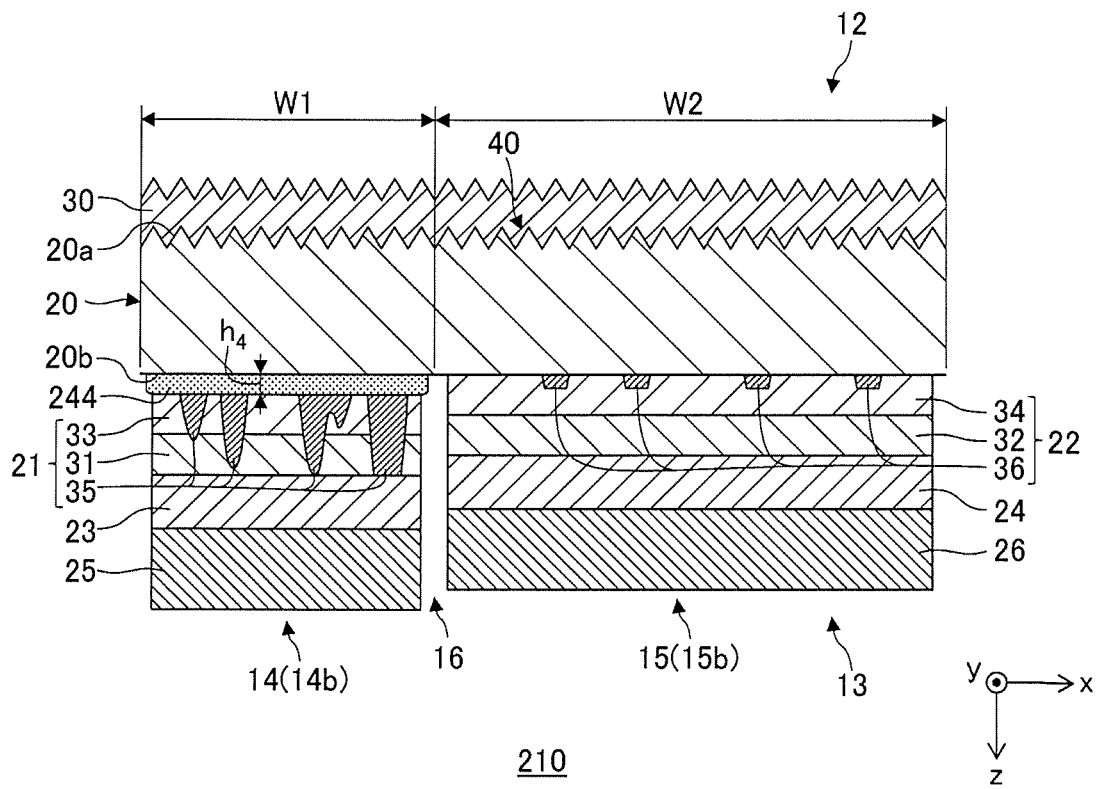
FIG. 8 is a cross-sectional view showing the structure of a solar cell according to a variation.

FIG. 8 is a cross-sectional view showing the configuration of a solar cell 210 according to a variation. This variation differs from the embodiment described above in that a high impurity density layer 244 is further provided between the second principal surface 20b in the first region W1 and the first semiconductor layer 21. As in the case of the variation described above, the high impurity density layer 244 is a portion where the density of the impurity of the first conductivity type is high. For example, the high impurity density layer 244 includes phosphorus (P) as the impurity of the first conductivity type.

The high impurity density layer 244 is provided in the first region W1 and is provided to avoid the second region W2. As in the case of the first amorphous semiconductor layer 31, the high impurity density layer 244 can be formed by a CVD method or the like and can be made of crystalline silicon, amorphous silicon, silicon oxide, silicon oxynitride, silicon nitride, or the like. The high impurity density layer 244 may be formed selectively in the first region W1 by providing a mask in the second region W2. Alternatively, the high impurity density layer 244 may be formed both in the first region W1 and in the second region W2 and then the portion formed on the second region W2 may be removed.

The impurity density of the high impurity density layer 244 is about $1\times10^{19}/cm^3$-$5\times10^{20}/cm^3$, and, for example, about $5\times10^{19}/cm^3$-$1\times10^{20}/cm^3$. It is preferred that the impurity density of the high impurity density layer 244 be lower than the impurity density in the first amorphous semiconductor layer 31. The high impurity density layer 244 is provided such that a height $h_4$ from the second principal surface 20b is 100 nm or less. For example, the height $h_4$ is about 0.1 nm-50 nm. It is preferred that the height $h_4$ of the high impurity density layer 244 be about 0.1 nm-3 nm, and, for example, 2 nm or less.

This variation can further reduce the amount of minority carriers in the neighborhood of the first region W1 and improve passivation by providing the high impurity density layer 244. In this way, the reduction of passivation resulting from providing the first crystalline semiconductor part 35 is compensated, and the requirements for passivation and low resistance are both met more suitably.

The solar cell (210) according to one embodiment may further include a high impurity density layer (244) provided between the one principal surface (the second principal surface 20b) and the first semiconductor layer (21) and having a higher density of an impurity of the first conductivity type than the substrate (20).

(Variation 3)

Figure 9:
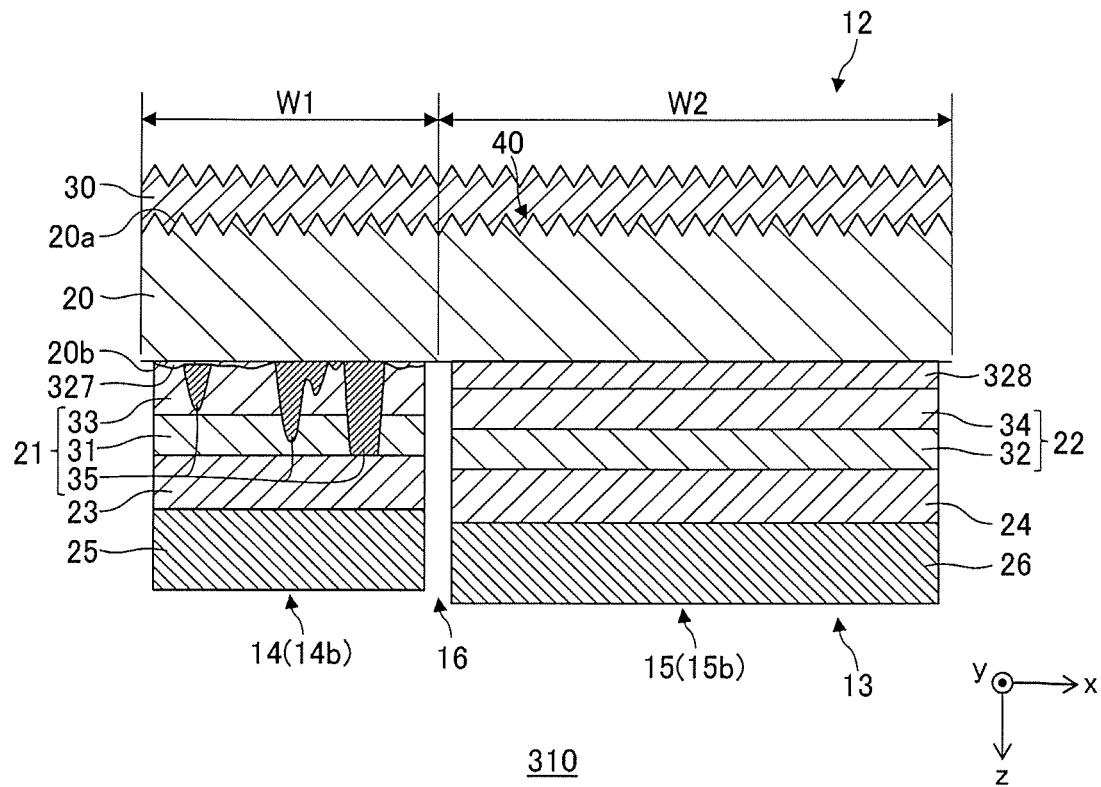
FIG. 9 is a cross-sectional view showing the structure of a solar cell according to a variation.

FIG. 9 is a cross-sectional view showing the configuration of a solar cell 310 according to a variation. This variation differs from the embodiment described above in that a first oxide layer 327 is provided between the second principal surface 20b and the first semiconductor layer 21, and a second oxide layer 328 is provided between the second principal surface 20b and the second semiconductor layer 22.

The first oxide layer 327 is provided on the first region W1 on the second principal surface 20b, and the second oxide layer 328 is provided on the second region W2 on the second principal surface 20b. The first oxide layer 327 and the second oxide layer 328 are made of, for example, silicon oxide, silicon nitride, aluminum oxide, etc.

The first oxide layer 327 and the second oxide layer 328 function as a passivation layer of the second principal surface 20b. Further, the first oxide layer 327 functions as a foundation layer for controlling the amount of production of the first crystalline semiconductor layer 35 included in the first semiconductor layer 21. Similarly, the second oxide layer 328 functions as a foundation layer for inhibiting production of the second crystalline semiconductor part within the second semiconductor layer 22. By forming the second oxide layer 328 to have a large thickness, the second crystalline semiconductor part is substantially prevented from being formed on the second oxide layer 328.

In the case the oxide layer is provided on the crystalline silicon substrate 20, production of crystalline silicon is inhibited more easily and amorphous silicon is produced more easily than in the case of not providing the oxide layer. Accordingly, the amount of production of the first crystalline semiconductor part 35 formed on the second principal surface 20b is controlled by controlling the amount, thickness, range of formation of the oxide layer on the second principal surface 20b.

In the first region W1, the first oxide layer 327 is formed to have a relatively small thickness to produce a formation layer on which the first crystalline semiconductor part 35 is easily formed. Further, the first oxide layer 327 is formed such that the second principal surface 20b is exposed in part, or the thickness of the first oxide layer 327 is small in part, instead of coating the entirety of the second principal surface 20b in the first region W1 uniformly. This promotes production of crystalline silicon in a portion where the first oxide layer 327 is not provided and in a portion where the thickness of the first oxide layer 327 is small, allowing the first crystalline semiconductor part 35 to be formed in part.

In the second region W2, on the other hand, the second oxide layer 328 is formed to have a relatively large thickness to result in a formation on which the second crystalline semiconductor part is not easily formed. Further, the second oxide layer 328 is formed such that the entirety of the second principal surface 20b in the second region W2 is coated uniformly. In other words, the second oxide layer 328 is to ensure that the second principal surface 20b is not exposed in part in the absence of the second oxide layer 328, or the thickness of the second oxide layer 328 is not small in part. This inhibits production of crystalline silicon on the second oxide layer 328 and substantially prevents formation of the second crystalline semiconductor part.

The first oxide layer 327 and the second oxide layer 328 can be formed by a CVD method or a chemical oxidation method. The thickness and the range of formation of the first oxide layer 327 and the second oxide layer 328 can be varied by controlling the condition of formation of the oxide layer or the growth time. The first oxide layer 327 is formed before the first semiconductor layer 21 is formed, and the first semiconductor layer 21 is formed on the first oxide layer 327. The second oxide layer 328 is formed before the second semiconductor layer 22 is formed, and the second semiconductor layer 22 is formed on the second oxide layer 328.

According to this embodiment, the amount of formation of the first crystalline semiconductor part and the second crystalline semiconductor part is suitably controlled by providing the first oxide layer 327 and the second oxide layer 328. Further, the first oxide layer 327 and the second oxide layer 328 are allowed to function as a passivation layer to enhance passivation of the second principal surface 20b. Thus, according to this variation, the requirements for passivation and low resistance can both be met more suitably, and the power generation efficiency of the solar cell 310 is increased.

The solar cell (310) according to one embodiment may further include a first oxide layer (327) provided between the one principal surface (the second principal surface 20b) and the first semiconductor layer 21 and at least in part on the first region (W1).

The solar cell (310) according to one embodiment may further include a second oxide layer (328) provided between the one principal surface (the second principal surface 20b) and the second semiconductor layer (22) and at least in part on the second region (W2). The thickness of the second oxide layer (328) may be larger than the thickness of the first oxide layer (327).

In a method of manufacturing the solar cell (310) according to one embodiment, the first amorphous semiconductor layer (31) and the first crystalline semiconductor part (35) may be formed on a formation of an oxide layer (the first oxide layer 327) formed at least in part on the one principal surface (the second principal surface 20b).

(Variation 4)

Figure 10:
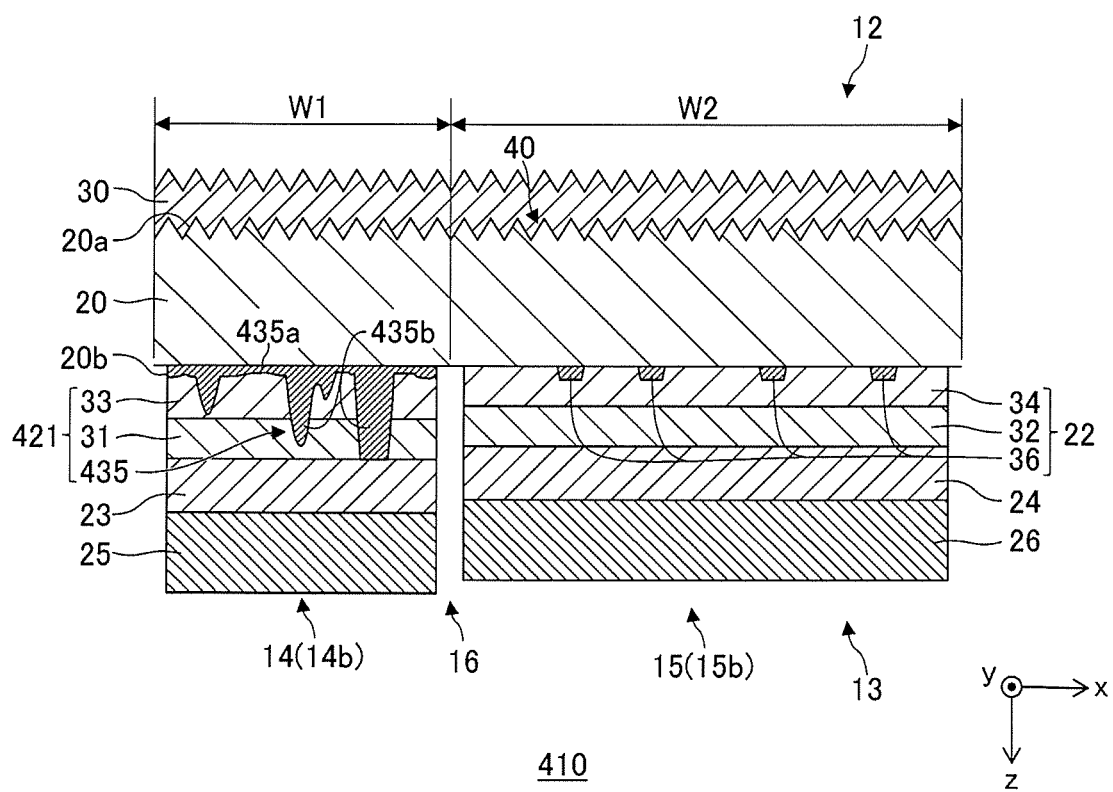
FIG. 10 is a cross-sectional view showing the structure of a solar cell according to a variation.

FIG. 10 is a cross-sectional view showing the configuration of a solar cell 410 according to a variation. This variation differs from the embodiment described above in that a first crystalline semiconductor part 435 includes a base layer 435a and a plurality of columnar parts 435b extending from the base layer 435a toward the first transparent electrode layer 23.

A first semiconductor layer 421 includes the first amorphous semiconductor layer 31, the third amorphous semiconductor layer 33, and the first crystalline semiconductor part 435. The first crystalline semiconductor part 435 includes a base layer 435a formed in a small thickness on the first region W1 on the second principal surface 20b, and a plurality of columnar parts 435b extending from the base layer 435a toward the first transparent electrode layer 23. The third amorphous semiconductor layer 33 is provided on the base layer 435a, and the first amorphous semiconductor layer 31 is provided on the third amorphous semiconductor layer 33.

The base layer 435a is provided to occupy half or more of area on the first region W1. For example, the base layer 435a is provided to occupy 80% or larger, or 90% or larger, of the area on the first region W1. The thickness of the base layer 435a is about 0.5 nm-25 nm, and, for example, about 0.5 nm-5 nm. The base layer 435a may be formed to have a thickness smaller than that of the first amorphous semiconductor layer 31 or the third amorphous semiconductor layer 33. Each of the plurality of columnar parts 435b is provided to extend from the base layer 435a toward the first transparent electrode layer 23 and to extend through the first amorphous semiconductor layer 31 and the third amorphous semiconductor layer 33.

According to this variation, the series resistance of the first region W1 is further reduced by enlarging the area of the base layer 435a formed by a highly conductive crystalline semiconductor. By forming the base layer 435a to have a small thickness, the number of defects per a unit area on the first region W1 is reduced and the impact from lattice defects on reduction of passivation is reduced. Thus, according to the variation, the power generation efficiency of the solar cell 410 is increased further.

In the solar cell (410) according to one embodiment, the first crystalline semiconductor part (435) may include a base layer (435a) provided to coat half or more of the first region (W1) and a columnar part (435b) extending from the baser layer (435a) toward the first transparent electrode (23).

The embodiment of the present invention is not limited to those described above and appropriate combinations or replacements of the features of the embodiment and the variations are also encompassed by the present invention.

It should be understood that the invention is not limited to the above-described embodiments and modifications but may be further modified into various forms on the basis of the spirit of the invention. Additionally, those modifications are included in the scope of the invention.

What is claimed is:

1. A solar cell comprising:
   a crystalline semiconductor substrate of a first conductivity type;
   a first semiconductor layer provided on a first region on one principal surface of the substrate;
   a second semiconductor layer provided on a second region on the one principal surface different from the first region;
   a first transparent electrode layer provided on the first semiconductor layer; and
   a second transparent electrode layer provided on the second semiconductor layer, wherein
   the first semiconductor layer includes a first amorphous semiconductor layer of the first conductivity type and a first crystalline semiconductor part extending from the one principal surface toward and reaching the first transparent electrode layer,
   the second semiconductor layer includes a second amorphous semiconductor layer of a second conductivity type different from the first conductivity type and a second crystalline semiconductor part provided on the one principal surface, and
   an amount of the first crystalline semiconductor part provided per a unit area on the first region is higher than an amount of the second crystalline semiconductor part provided per a unit area on the second region.

2. The solar cell according to claim 1, wherein
   the first semiconductor layer further includes a third amorphous semiconductor layer that is provided between the one principal surface and the first amorphous semiconductor layer and that is substantially intrinsic.

3. The solar cell according to claim 2, wherein
   the first crystalline semiconductor part is provided to extend through the first amorphous semiconductor layer and the third amorphous semiconductor layer and reach the first transparent electrode layer.

4. The solar cell according to claim 1, wherein
   the second semiconductor layer further includes a fourth amorphous semiconductor layer that is provided between the one principal surface and the second amorphous semiconductor layer and that is substantially intrinsic.

5. The solar cell according to claim 4, wherein
   an actual density of at least a portion of the fourth amorphous semiconductor layer in contact with the one principal surface is lower than an actual density of a portion of the first semiconductor layer in contact with the one principal surface.

6. The solar cell according to claim 1, wherein
   the first crystalline semiconductor part is provided in part on the first region.

7. The solar cell according to claim 1, wherein
   the first crystalline semiconductor part includes a base layer provided to coat half or more of the first region and a columnar part extending from the base layer toward the first transparent electrode layer.

8. The solar cell according to claim 1, wherein
   the first amorphous semiconductor layer has a higher density of impurity of the first conductivity type than the substrate.

9. The solar cell according to claim 1, wherein
   a height of the first crystalline semiconductor part from the one principal surface is larger than a height of the second crystalline semiconductor part from the one principal surface.

10. The solar cell according to claim 1, wherein
    the first region is narrower than the second region.

11. The solar cell according to claim 1, wherein
    the substrate includes a high impurity density region provided immediately below the one principal surface in the first region and having a higher density of an impurity of the first conductivity type than the other portion of the substrate.

12. The solar cell according to claim 1, further comprising:
    a high impurity density layer provided between the one principal surface and the first semiconductor layer and having a higher density of an impurity of the first conductivity type than the substrate.

13. The solar cell according to claim 1, further comprising:
    a first oxide layer provided between the one principal surface and the first semiconductor layer and at least in part on the first region.

14. The solar cell according to claim 13, further comprising:

a second oxide layer provided between the one principal surface and the second semiconductor layer and at least in part on the second region, wherein a thickness of the second oxide layer is larger than a thickness of the first oxide layer.

15. A method of manufacturing a solar cell, comprising:

forming a first semiconductor layer in a first region on one principal surface of a crystalline semiconductor substrate of a first conductivity type;

forming a second semiconductor layer in a second region of the one principal surface different from the first region; and forming a first transparent electrode layer on the first semiconductor layer and a second transparent electrode layer on the second semiconductor layer, wherein the first semiconductor layer includes a first amorphous semiconductor layer of the first conductivity type and a first crystalline semiconductor part extending from the one principal surface toward and reaching the first transparent electrode layer, the second semiconductor layer includes a second amorphous semiconductor layer of a second conductivity type different from the first conductivity type and a second crystalline semiconductor part provided on the one principal surface, an amount of the first crystalline semiconductor part provided per a unit area on the first region is higher than an amount of the second crystalline semiconductor part provided per a unit area on the second region, the first amorphous semiconductor layer and the first crystalline semiconductor part are formed at the same time, and the second amorphous semiconductor layer and the second crystalline semiconductor part are formed at the same time.

* * * * *